US012563789B2

(12) United States Patent
Lee

(10) Patent No.: US 12,563,789 B2
(45) Date of Patent: Feb. 24, 2026

(54) THIN FILM TRANSISTOR AND METHOD FOR MANUFACTURING THE SAME

(71) Applicant: Samsung Display Co., LTD., Yongin-si (KR)

(72) Inventor: Hyun-Jung Lee, Dongducheon-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 605 days.

(21) Appl. No.: 17/875,336

(22) Filed: Jul. 27, 2022

(65) Prior Publication Data

US 2023/0178659 A1 Jun. 8, 2023

(30) Foreign Application Priority Data

Dec. 6, 2021 (KR) ........................ 10-2021-0172895

(51) Int. Cl.
H10D 30/67 (2025.01)
H10D 30/01 (2025.01)

(52) U.S. Cl.
CPC ....... H10D 30/6757 (2025.01); H10D 30/031 (2025.01); H10D 30/6729 (2025.01); H10D 30/6755 (2025.01)

(58) Field of Classification Search
CPC ............. H10D 30/6757; H10D 30/031; H10D 30/6729; H10D 30/6755; H10D 62/882; H10D 86/0221–0229; H10D 86/421–427; H10D 30/6758; H10D 99/00; H10D 30/673; H10D 30/674; H10D 30/0321; H10D 30/0327; H10D 30/501–509; A01G 13/20; A61K 40/40; H02K 15/027; H10H 20/8312; H01L 2924/13069

See application file for complete search history.

(56) References Cited

U.S. PATENT DOCUMENTS

| | | | | | |
|---|---|---|---|---|---|
| 7,880,170 | B2 * | 2/2011 | Kim | ....................... | H10K 71/60 |
| | | | | | 257/66 |
| 9,947,804 | B1 * | 4/2018 | Frougier | ............ | H10D 30/6743 |
| 2006/0263955 | A1 * | 11/2006 | Yamazaki | .......... | H10D 30/6717 |
| | | | | | 257/E29.279 |
| 2009/0001375 | A1 * | 1/2009 | Yamazaki | .............. | H10D 62/40 |
| | | | | | 257/E29.004 |
| 2012/0267623 | A1 | 10/2012 | Isobe et al. | | |

(Continued)

FOREIGN PATENT DOCUMENTS

| | | |
|---|---|---|
| JP | 2008034760 A | 2/2008 |
| JP | 6104420 | 3/2017 |

(Continued)

*Primary Examiner* — Chad M Dicke
*Assistant Examiner* — Gary Abel
(74) *Attorney, Agent, or Firm* — CANTOR COLBURN LLP

(57) ABSTRACT

The present disclosure relates to a thin film transistor and a manufacturing method thereof, and the thin film transistor according to an embodiment includes: a substrate; a buffer layer positioned on the substrate and defining a trench on an upper surface thereof; a semiconductor positioned in the trench of the buffer layer; a gate electrode overlapping the semiconductor in a plan view; and a source electrode and a drain electrode, which are connected to the semiconductor.

20 Claims, 12 Drawing Sheets

(56)     References Cited

U.S. PATENT DOCUMENTS

| | | | | |
|---|---|---|---|---|
| 2016/0118384 A1* | 4/2016 | Glass | ............... | H10D 84/0193 |
| | | | | 257/192 |
| 2018/0158927 A1* | 6/2018 | Mohapatra | ........... | H10D 64/017 |
| 2018/0190830 A1* | 7/2018 | Ren | ..................... | H10D 86/411 |
| 2019/0109247 A1* | 4/2019 | Zandian | ............... | H10F 77/148 |
| 2019/0279875 A1 | 9/2019 | Karmous | | |
| 2020/0144347 A1* | 5/2020 | Seo | ..................... | H10D 86/441 |
| 2021/0183912 A1* | 6/2021 | Liu | ..................... | H10D 86/441 |
| 2023/0134887 A1* | 5/2023 | Kim | .................... | H10D 86/451 |
| | | | | 257/40 |
| 2023/0155034 A1* | 5/2023 | Inari | ................ | H10D 30/6729 |
| | | | | 257/288 |

FOREIGN PATENT DOCUMENTS

| | | | |
|---|---|---|---|
| KR | 20020019814 | A | 3/2002 |
| KR | 100925210 | | 11/2009 |
| KR | 20190064547 | A | 6/2019 |
| KR | 1020190075630 | | 7/2019 |
| KR | 1020210033878 | | 3/2021 |

* cited by examiner

THIN FILM TRANSISTOR AND METHOD FOR MANUFACTURING THE SAME

This application claims priority to Korean Patent Application No. 10-2021-0172895 filed on Dec. 6, 2021, and all the benefits accruing therefrom under 35 U.S.C. § 119, the content of which in its entirety is herein incorporated by reference.

BACKGROUND

1. Field

The present disclosure relates to a thin film transistor and a manufacturing method thereof.

2. Description of the Related Art

A transistor included in various electronic devices such as a display device may include a gate electrode, a semiconductor overlapping the gate electrode, and a source electrode and a drain electrode connected to the semiconductor.

The semiconductor is an important element that determines the characteristics of the transistor. Silicon (Si) is generally used as such a semiconductor. The silicon is classified into amorphous silicon and polysilicon according to a crystal form. The amorphous silicon has a simple manufacturing process but has low charge mobility, so there is a limitation in manufacturing high performance transistors, and the polysilicon has high charge mobility while crystallizing the silicon is difficult, so it requires a complicated manufacturing process at a high cost. In order to avoid these drawbacks, research on transistors using an oxide semiconductor having higher electron mobility than the amorphous silicon, a higher ON/OFF ratio, a lower cost than the polysilicon, and higher uniformity is being conducted.

By adjusting the length and the width of the channel of the semiconductor, the characteristics of the transistor can be improved. In this case, increasing the length of the semiconductor channel has a limitation depending on a resolution. This is because the area occupied by the semiconductor increases as the length of the channel of the semiconductor increases. In addition, reducing the width of the channel of the semiconductor is limited due to processing capability. In the case of polysilicon, patterning may be carried out by dry etching, and in the case of the oxide semiconductor, patterning may be carried out by wet etching. When the pattern is formed by the wet etching method, it is difficult to form a narrow width of the channel of the semiconductor because skew and process dispersion are relatively large.

The above information disclosed in this Background section is only for enhancement of understanding of the background of the described technology, and therefore it may contain information that does not form the prior art that is already known in this country to a person of ordinary skill in the art.

SUMMARY

Embodiments are to provide a thin film transistor including a semiconductor having a narrow channel width, and a manufacturing method thereof.

A thin film transistor according to an embodiment includes: a substrate; a buffer layer positioned on the substrate and defining a trench on an upper surface thereof; a semiconductor positioned in the trench of the buffer layer; a gate electrode overlapping the semiconductor in a plan view;

and a source electrode and a drain electrode, which are connected to the semiconductor.

The semiconductor may be positioned only within the trench, and not outside the trench.

The semiconductor may include: a channel overlapping the gate electrode in the plan view, and a first region and a second region, which are positioned on opposite sides of the channel, respectively, where the first region may be connected to the source electrode, and the second region may be connected to the drain electrode.

The channel, the first region, and the second region of the semiconductor may be positioned within the trench as a whole.

The width of the channel of the semiconductor may be the same as the width of the trench.

The semiconductor may be made of an oxide semiconductor.

The thin film transistor according to an embodiment may further include: a gate insulating layer positioned between the semiconductor and the gate electrode, and the thickness of a first part of the gate insulating layer, which overlaps the semiconductor, is greater than the thickness of a second part of the gate insulating layer, which does not overlap the semiconductor.

A manufacturing method of a thin film transistor according to an embodiment includes: forming a buffer layer on a substrate; forming a trench on an upper surface of the buffer layer; forming a semiconductor material layer on the buffer layer; forming a photoresist pattern on the semiconductor material layer; reducing a thickness of the photoresist pattern to leave a part of the photoresist pattern positioned within the trench and to remove the remaining part of the photoresist pattern outside the trench; patterning the semiconductor material layer to form a semiconductor by using the photoresist pattern as a mask; forming a gate insulating layer on the semiconductor; and forming a gate electrode on the gate insulating layer.

The forming of the trench in the buffer layer may be performed by a dry etching process.

The semiconductor material layer may be made of an oxide semiconductor material.

The patterning of the semiconductor material layer to form the semiconductor may be performed by a wet etching process.

The reducing of the thickness of the photoresist pattern may be performed by either a chemical mechanical polishing process or an ashing process.

The forming of the photoresist pattern may be to coat a photosensitive organic material and to proceed with an exposure process.

The exposure process may include full exposure without a photomask.

In the reducing of the thickness of the photoresist pattern, the reduced upper surface of the photoresist pattern may be flush with the upper surface of the portion of the semiconductor material layer positioned outside the trench.

The semiconductor may be positioned only within the trench, not outside the trench.

The semiconductor may include a channel overlapping the gate electrode in a plan view, and a first region and a second region, which are positioned on opposite sides of the channel, respectively. The first region may be connected to the source electrode, and the second region may be connected to the drain electrode.

The channel, the first region, and the second region of the semiconductor may be positioned as a whole within the trench.

The width of the channel of the semiconductor may be the same as the width of the trench.

The semiconductor may be an oxide semiconductor.

The thickness of a first part of the gate insulating layer, which overlaps the semiconductor, may be greater than the thickness of a second part of the gate insulating layer, which does not overlap the semiconductor.

According to embodiments, by forming the width of the channel of the semiconductor to be narrow, it is possible to effectively improve the characteristic of the thin film transistor.

BRIEF DESCRIPTION OF THE DRAWINGS

FIG. 4 to FIG. 11 are cross-sectional views for explaining a manufacturing sequence of a thin film transistor according to an embodiment.

FIG. 12 is a cross-sectional view showing one pixel of a display device including a thin film transistor according to an embodiment.

DETAILED DESCRIPTION

Figure 1:
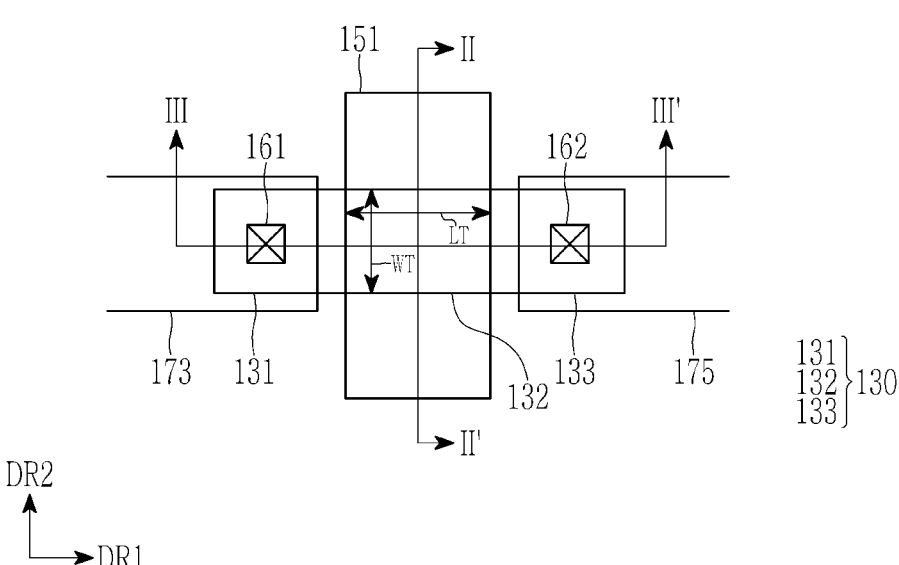
FIG. 1 is a top plan view showing a thin film transistor according to an embodiment.

The present invention will be described more fully hereinafter with reference to the accompanying drawings, in which embodiments of the invention are shown. As those skilled in the art would realize, the described embodiments may be modified in various different ways, all without departing from the spirit or scope of the present invention.

Descriptions of parts not related to the present invention are omitted, and like reference numerals designate like elements throughout the specification.

Further, since sizes and thicknesses of constituent members shown in the accompanying drawings are arbitrarily given for better understanding and ease of description, the present invention is not limited to the illustrated sizes and thicknesses. In the drawings, the thickness of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. In addition, unless explicitly described to the contrary, the word "comprise", and variations such as "comprises" or "comprising", will be understood to imply the inclusion of stated elements but not the exclusion of any other elements.

Further, throughout the specification, the phrase "in a plan view" means viewing a target portion from the top (view in a third direction DR3), and the phrase "in a cross-sectional view" means viewing a cross-section formed by vertically cutting a target portion from the side.

First, a thin film transistor according to an embodiment is described with reference to FIG. 1 to FIG. 3 as follows.

Figure 2:
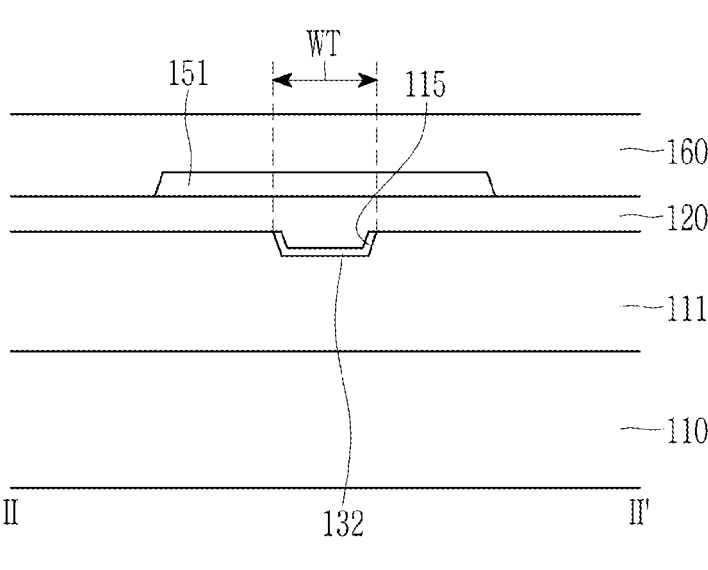
FIG. 2 is a cross-sectional view of a thin film transistor taken along line II-II' of FIG. 1 according to an embodiment.
Figure 3:
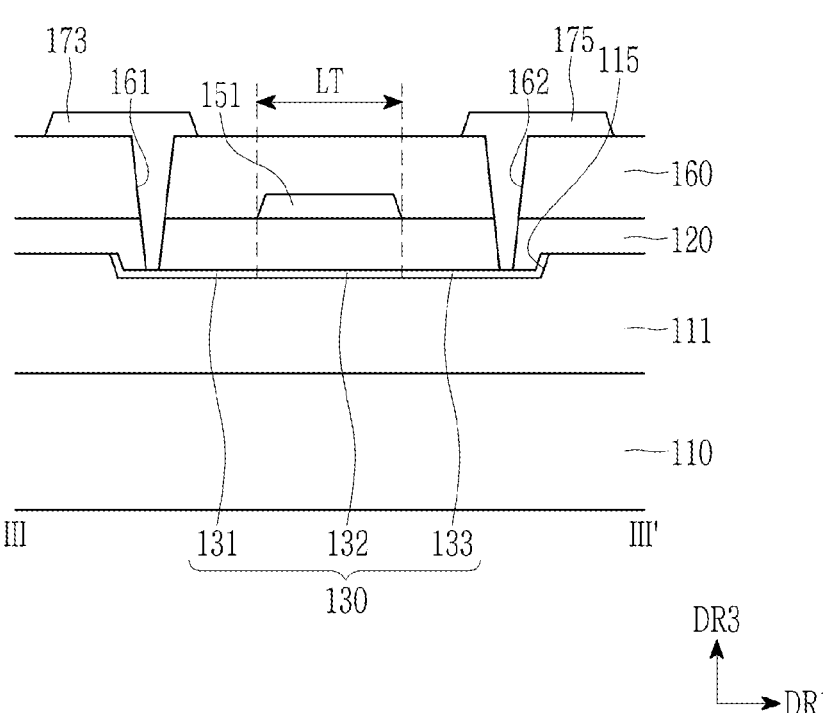
FIG. 3 is a cross-sectional view of a thin film transistor taken along line III-III' of FIG. 1 according to an embodiment.

FIG. 1 is a top plan view showing a thin film transistor according to an embodiment, FIG. 2 is a cross-sectional view of a thin film transistor taken along line II-II' of FIG. 1 according to an embodiment, and FIG. 3 is a cross-sectional view of a thin film transistor taken along line III-III' of FIG. 1 according to an embodiment.

As shown in FIG. 1 to FIG. 3, the thin film transistor according to an embodiment includes a substrate 110, a buffer layer 111 positioned on the substrate 110 and defining a trench 115 on an upper surface thereof, a semiconductor 130 positioned in the trench 115 of the buffer layer 111, a gate electrode 151 overlapping the semiconductor 130 in a plan view, and a source electrode 173 and a drain electrode 175 which are connected to the semiconductor 130.

The substrate 110 may include at least one among polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, cellulose triacetate, and cellulose acetate propionate. The substrate 110 may be a rigid substrate or a flexible substrate that is capable of bending, folding, rolling, etc. The substrate 110 may be single-layered or multi-layered. The substrate 110 may be alternately laminated with at least one base layer and at least one inorganic layer, which include sequentially laminated polymer resins.

The buffer layer 111 is positioned between the substrate 110 and the semiconductor 130 to prevent impurities from flowing into the semiconductor 130 from the substrate 110, thereby improving the characteristics of the semiconductor 130. In addition, the buffer layer 111 may relieve the stress of the semiconductor 130 formed on the buffer layer 111 by planarizing the substrate 110. The buffer layer 111 may have a single-layered or a multi-layered structure. The buffer layer 111 may include an inorganic insulating material or an organic insulating material such as a silicon nitride (SiNx), a silicon oxide (SiOx), or a silicon oxynitride (SiOxNy).

The buffer layer 111 may define a trench 115 therein. The trench 115 is defined on the upper surface of the buffer layer 111. The trench 115 has a predetermined depth from the upper surface of the buffer layer 111. The trench 115 may be approximately quadrangular in a plan view, but the plane shape of the trench 115 is not limited thereto.

A barrier layer may be further positioned between the substrate 110 and the buffer layer 111. The barrier layer may have a single-layered or a multi-layered structure. The barrier layer may include an inorganic insulating material such as a silicon nitride (SiNx), a silicon oxide (SiOx), or a silicon oxynitride (SiOxNy).

Although not shown, a light blocking layer may be further positioned between the substrate 110 and the buffer layer 111. The light blocking layer may serve to block light incident to the semiconductor 130. The light blocking layer may overlap the semiconductor 130 in a plan view and may have a wider width than the semiconductor 130.

The semiconductor 130 may be positioned in the trench 115 of the buffer layer 111. The semiconductor 130 may cover the bottom and side surfaces of the trench 115. The semiconductor 130 may include a first region 131, a channel 132, and a second region 133. The channel 132 may be positioned between the first region 131 and the second region 133. The semiconductor 130 may have a rod shape extending approximately along the first direction DR1 in a plan view. However, the planar shape of the semiconductor 130 according to the invention is not limited thereto, and may be variously changed. The first region 131, the channel 132, and the second region 133 of the semiconductor 130 may be positioned entirely in the trench 115. That is, the semiconductor 130 may not be positioned beyond the trench 115. The edge of the semiconductor 130 may coincide with the edge of the trench 115. Therefore, the planar shape of the trench 115 may be substantially the same as the planar shape of the semiconductor 130.

The channel 132 of the semiconductor 130 may have a predetermined length LT and a predetermined width WT. The length LT of the channel 132 means a distance from the boundary between the first region 131 and the channel 132 to a boundary between the second region 133 and the channel 132. The length LT of the channel 132 may be measured in the first direction DR1. That is, the length LT may be substantially equal to a length of the gate electrode 151 in the first direction DR1. The width WT of the channel 132 means the distance from one end of the channel 132 to the other end along a direction perpendicular to the direction of the length LT of the channel 132. The width WT of the channel 132 may be measured in the second direction DR2. The second direction DR2 may be a direction perpendicular to the first direction DR1. The width WT of the channel 132 may be substantially equal to the width of the trench 115 in the second direction DR2. Here, the first, second, and third directions DR1, DR2, and DR3 are perpendicular to each other.

The semiconductor 130 may be made of an oxide semiconductor. The oxide semiconductor may include at least one among a primary metal oxide such as an indium (In) oxide, a tin (Sn) oxide, or a zinc (Zn) oxide, a binary metal oxide such as In—Zn-based oxides, Sn—Zn-based oxides, Al—Zn-based oxides, Zn—Mg-based oxides, Sn—Mg-based oxides, In—Mg-based oxides, or In—Ga-based oxides, a ternary metal oxide such as In—Ga—Zn-based oxides, In—Al—Zn-based oxides, In—Sn—Zn-based oxides, Sn—Ga—Zn-based oxides, Al—Ga—Zn-based oxides, Sn—Al—Zn-based oxides, In—Hf—Zn-based oxides, In—La—Zn-based oxides, In—Ce—Zn-based oxides, In—Pr—Zn-based oxides, In—Nd—Zn-based oxides, In—Sm—Zn-based oxides, In—Eu—Zn-based oxides, In—Gd—Zn-based oxides, In—Tb—Zn-based oxides, In—Dy—Zn-based oxides, In—Ho—Zn-based oxides, In—Er—Zn-based oxides, In—Tm—Zn-based oxides, In—Yb—Zn-based oxides, or In—Lu—Zn-based oxides, and a quaternary metal oxide such as In—Sn—Ga—Zn-based oxides, In—Hf—Ga—Zn-based oxides, In—Al—Ga—Zn-based oxides, In—Sn—Al—Zn-based oxides, In—Sn—Hf—Zn-based oxides, or In—Hf—Al—Zn-based oxides. For example, the semiconductor 130 may include an Indium-Gallium-Zinc Oxide ("IGZO") among the In—Ga—Zn-based oxides. However, the material of the semiconductor 130 according to the invention is not limited thereto, and may be made of amorphous silicon or polycrystalline silicon in another embodiment.

The gate insulating layer 120 may be positioned on the semiconductor 130. The gate insulating layer 120 may have a single-layered or multi-layered structure. The gate insulating layer 120 may include an inorganic insulating material such as a silicon nitride (SiNx), a silicon oxide (SiOx), or a silicon oxynitride (SiOxNy). The gate insulating layer 120 may entirely cover the semiconductor 130. The gate insulating layer 120 may be positioned on the entirety of the substrate 110. The semiconductor 130 is positioned in the trench 115, and the gate insulating layer 120 is formed to fill the trench 115. Accordingly, the thickness of the portion of the gate insulating layer 120 that overlaps the semiconductor 130 may be greater than the thickness of the portion of the gate insulating layer 120 that does not overlap the semiconductor 130. The thicknesses are measured in the third direction DR3.

However, the present invention is not limited thereto, and the gate insulating layer 120 may overlap the channel 132 of the semiconductor 130 and may not overlap the first region 131 and the second region 133 in a plan view.

The gate electrode 151 may be positioned on the gate insulating layer 120. The gate electrode 151 may overlap the channel 132 of the semiconductor 130 in a plan view. The gate electrode 151 may include a metal material such as molybdenum (Mo), aluminum (Al), copper (Cu), and/or titanium (Ti). After forming the gate electrode 151, a doping process or a plasma treatment may be performed. The portion of the semiconductor 130 covered by the gate electrode 151 is not subjected to the doping or plasma treatment, and the portion of the semiconductor 130 not covered by the gate electrode 151 may be doped or treated with plasma to have the same characteristic as the conductor. That is, the first region 131 and the second region 133 of the semiconductor 130 do not overlap the gate electrode 151 in a plan view and may have the same characteristics as the conductor by being doped or plasma-treated.

An interlayer-insulating layer 160 may be positioned on the gate electrode 151. The interlayer-insulating layer 160 may be formed on the entirety of the substrate 110. The interlayer-insulating layer 160 may have a single-layered or multi-layered structure. The interlayer-insulating layer 160 may include an inorganic insulating material or an organic insulating material.

The source electrode 173 and the drain electrode 175 may be positioned on the interlayer-insulating layer 160. The interlayer-insulating layer 160 may define an opening 161 overlapping the first region 131 of the semiconductor 130 and the source electrode 173 in a plan view. The source electrode 173 may be connected to the first region 131 of the semiconductor 130 through the opening 161. The interlayer-insulating layer 160 may define an opening 162 overlapping the second region 133 of the semiconductor 130 and the drain electrode 175 in a plan view. The drain electrode 175 may be connected to the second region 133 of the semiconductor 130 through the opening 162. The source electrode 173 and the drain electrode 175 may include aluminum (Al), platinum (Pt), palladium (Pd), silver (Ag), magnesium (Mg), gold (Au), nickel (Ni), neodymium Nd, iridium (Ir), chromium (Cr), nickel (Ni), calcium (Ca), molybdenum (Mo), titanium (Ti), tungsten (W), and/or copper (Cu). The source electrode 173, the drain electrode 175, the semiconductor 130, and the gate electrode 151 may constitute one thin film transistor.

Hereinafter, a manufacturing method of a thin film transistor according to an embodiment is described as follows with reference to FIG. 4 to FIG. 11.

FIG. 4 to FIG. 11 are cross-sectional views for explaining a manufacturing sequence of a thin film transistor according to an embodiment.

Figure 4:
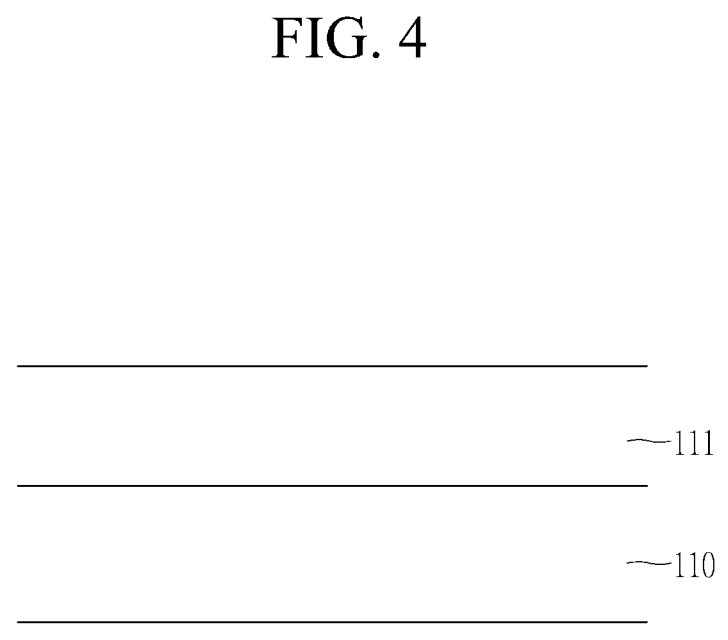

As shown in FIG. 4, on a substrate 110, a buffer layer 111 is formed by using an inorganic insulating material or an organic insulating material such as a silicon nitride (SiNx), a silicon oxide (SiOx), or a silicon oxynitride (SiOxNy).

Figure 5:
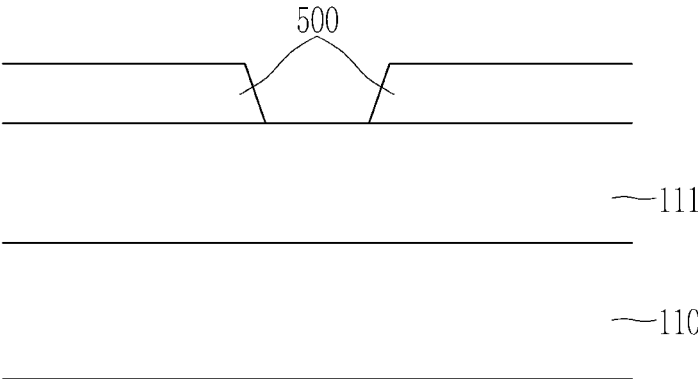

As shown in FIG. 5, a photosensitive organic material is coated on the buffer layer 111, and a photoprocess is performed to form a first photoresist pattern 500. The first photoresist pattern 500 may include a polymer compound that has photosensitivity, adhesion, and corrosion resistance together, and the properties may change when being irradiated with light. The first photoresist pattern 500 covers the remainder except for the predetermined region of the buffer layer 111.

Figure 6:
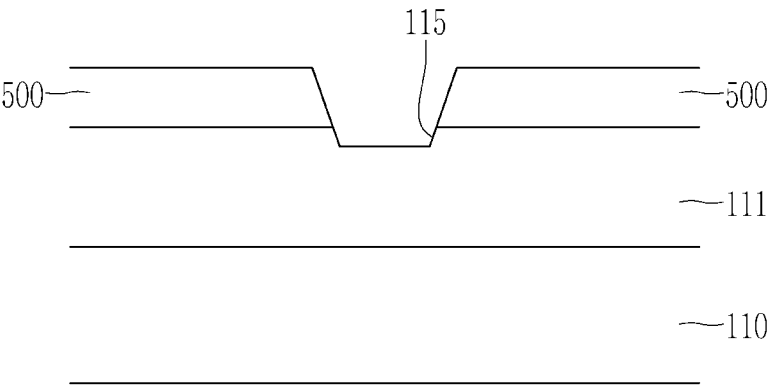

As shown in FIG. 6, a dry etching process is performed using the first photoresist pattern 500 as a mask. The dry etching is an etching process using a reaction by a gas plasma or an activated gas, and there are sputter etching using sputtering, reactive ion etching ("RIE"), vapor phase etching, etc. In the case of the dry etching process, skew and process dispersion may be reduced compared to the wet etching process. By dry etching the buffer layer 111, the trench 115 may be formed in the buffer layer 111. The trench 115 may be formed on the upper surface of the buffer layer 111. The trench 115 may have a predetermined depth from the upper surface of the buffer layer 111 in the third direction DR3.

Then, a strip process is performed to remove the first photoresist pattern 500.

Figure 7:
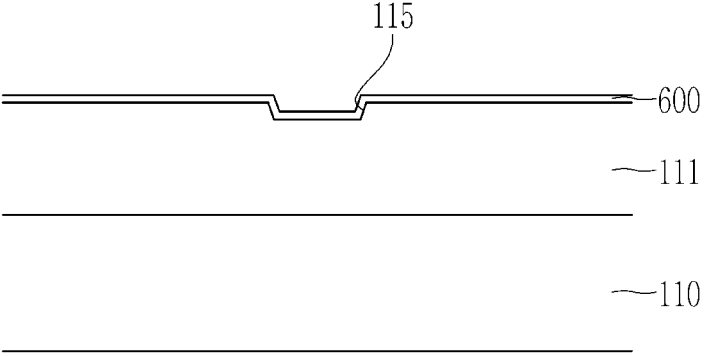

As shown in FIG. 7, a semiconductor material layer 600 is formed on the buffer layer 111 by using an oxide semiconductor material. However, the material of the semiconductor material layer 600 is not limited thereto, and may be made of amorphous silicon or polysilicon in another embodiment. The semiconductor material layer 600 may be positioned on the entirety of the buffer layer 111. The semiconductor material layer 600 may be positioned within the trench 115 of the buffer layer 111, and may also be positioned outside the trench 115. In this case, the height of the semiconductor material layer 600 positioned in the trench 115 may be lower than the height of the semiconductor material layer 600 positioned outside the trench 115. The height of the semiconductor material layer 600 means the distance from the substrate 110 to the upper surface of the semiconductor material layer 600. That is, the upper surface of the semiconductor material layer 600 is not planarized.

Figure 8:
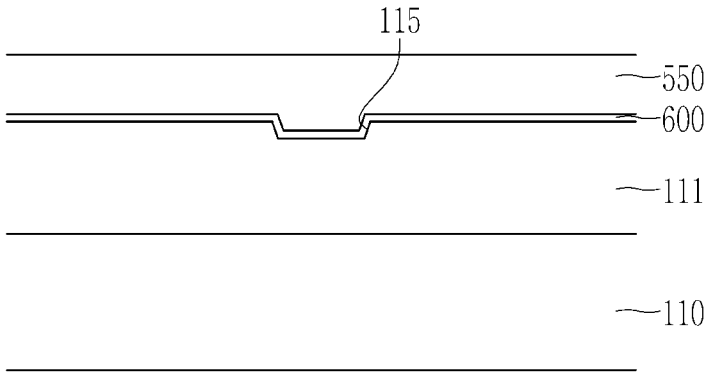

As shown in FIG. 8, a photosensitive organic material is coated on the semiconductor material layer 600, and an exposure process is performed to form a second photoresist pattern 550. The second photoresist pattern 550 includes a polymer compound with photosensitivity, adhesion, and corrosion resistance, and the properties may change when being irradiated with light. The second photoresist pattern 550 may completely cover the semiconductor material layer 600. That is, the second photoresist pattern 550 may be positioned on the entirety of the substrate 110. The second photoresist pattern 550 may be formed to completely fill the trench 115. The upper surface of the second photoresist pattern 550 may be planarized. At this time, the exposure process may proceed with full exposure without a photomask.

Figure 9:
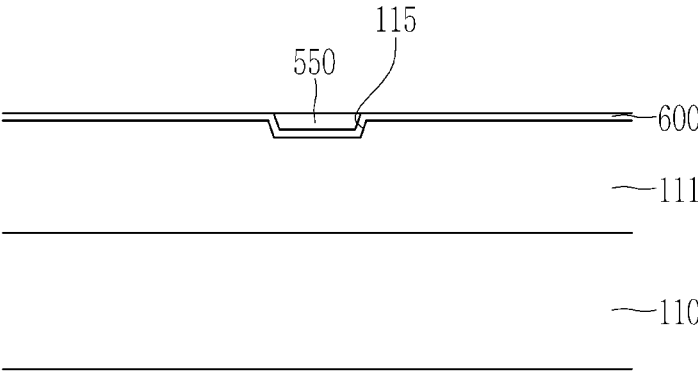

As shown in FIG. 9, the thickness of the second photoresist pattern 550 is reduced by performing a chemical mechanical polishing ("CMP") process or an ashing process. By reducing the thickness so that the upper surface of the second photoresist pattern 550 is flat, the portion of the second photoresist pattern 550 positioned in the trench 115 may be left, and all remaining portions may be removed. That is, the portion of the second photoresist pattern 550 positioned outside the trench 115 may be removed. The upper surface of the second photoresist pattern 550 remaining in the trench 115 may be flush with the upper surface of the portion of the semiconductor material layer 600 positioned outside the trench 115.

Figure 10:
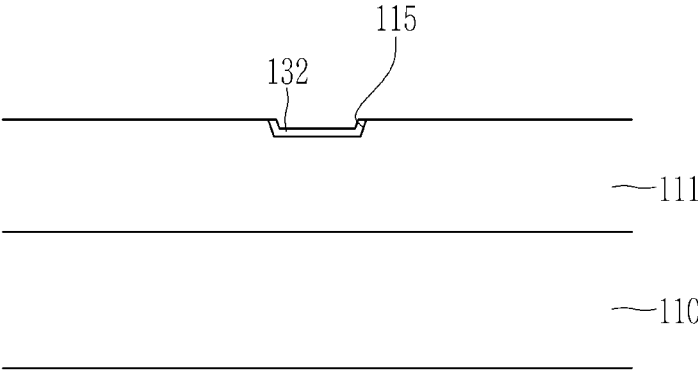

As shown in FIG. 10, a wet etching process is performed using the second photoresist pattern 550 as a mask. By wet-etching the semiconductor material layer 600, the semiconductor 130 may be formed. The portion of the semiconductor material layer 600 covered by the second photoresist pattern 550 may remain, and the portion of the semiconductor material layer 600 not covered by the second photoresist pattern 550 may be removed. The portion of the semiconductor material layer 600 positioned in the trench 115 may remain, and the portion of the semiconductor material layer 600 positioned outside the trench 115 may be removed.

Next, a strip process is performed to remove the second photoresist pattern 550.

Figure 11:
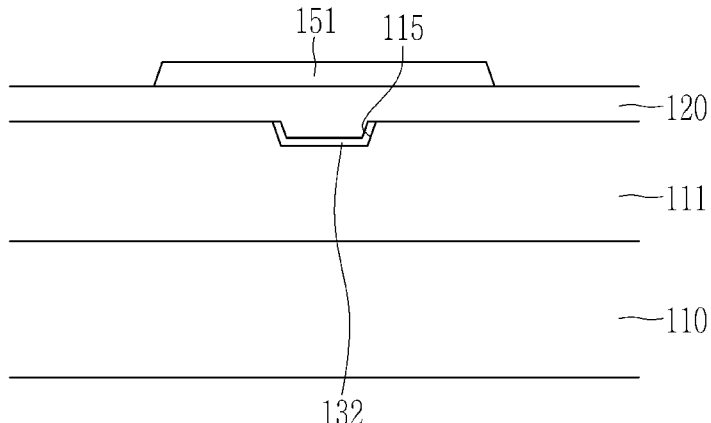

As shown in FIG. 11, a gate insulating layer 120 is formed on the semiconductor 130 by using an inorganic insulating material such as a silicon nitride (SiNx), a silicon oxide (SiOx), or a silicon oxynitride (SiOxNy). The gate insulating layer 120 may be positioned entirely on the substrate 110. The semiconductor 130 is positioned in the trench 115, and the gate insulating layer 120 is formed to fill the trench 115.

Accordingly, the thickness of the portion of the gate insulating layer 120 that overlaps the semiconductor 130 may be greater than the thickness of the portion of the gate insulating layer 120 that does not overlap the semiconductor 130.

However, the present invention is not limited thereto, and the patterning may be performed so that the gate insulating layer 120 overlaps the channel 132 of the semiconductor 130 and does not overlap the first region 131 and the second region 133 in a plan view.

Next, a doping process or plasma treatment may be performed using the gate electrode 151 as a mask. The portion of the semiconductor 130 covered by the gate electrode 151 is not subjected to the doping or the plasma treatment, and the region becomes the channel 132. The portion of the semiconductor 130 that is not covered by the gate electrode 151 may be doped or plasma treated to have the same characteristic as the conductor, and the region becomes the first region 131 and the second region 133. The first region 131 and the second region 133 may be positioned on opposite sides of the channel 132, respectively, in the first direction DR1.

The gate electrode 151 and the semiconductor 130 of the thin film transistor may be formed by the processes. Although not shown, the thin film transistor may be manufactured by forming an interlayer-insulating layer and forming a source electrode and a drain electrode in a subsequent process.

In the manufacturing process of the thin film transistor according to an embodiment, the trench 115 is formed in the buffer layer 111 by the dry etching process, and the semiconductor material layer 600 and the second photoresist pattern 550 are formed on the buffer layer 111, and then only the second photoresist pattern 550 is patterned so that the second photoresist pattern 550 remains only in the trench 115. Then, the semiconductor material layer 600 is patterned by a wet etching process to form the semiconductor 130. In this case, the width WT of the channel 132 of the semiconductor 130 may be determined by the width of the trench 115. Since the trench 115 is formed by the dry etching process, the trench 115 may have the width that is sufficiently narrow without increasing the skew and the process dispersion. Therefore, the width WT of the channel 132 of the semiconductor 130 may be stably formed to be narrow, and thus the characteristics of the thin film transistor may be effectively improved.

Hereinafter a display device including the thin film transistor according to an embodiment is described with reference to FIG. 12 as follows.

Figure 12:
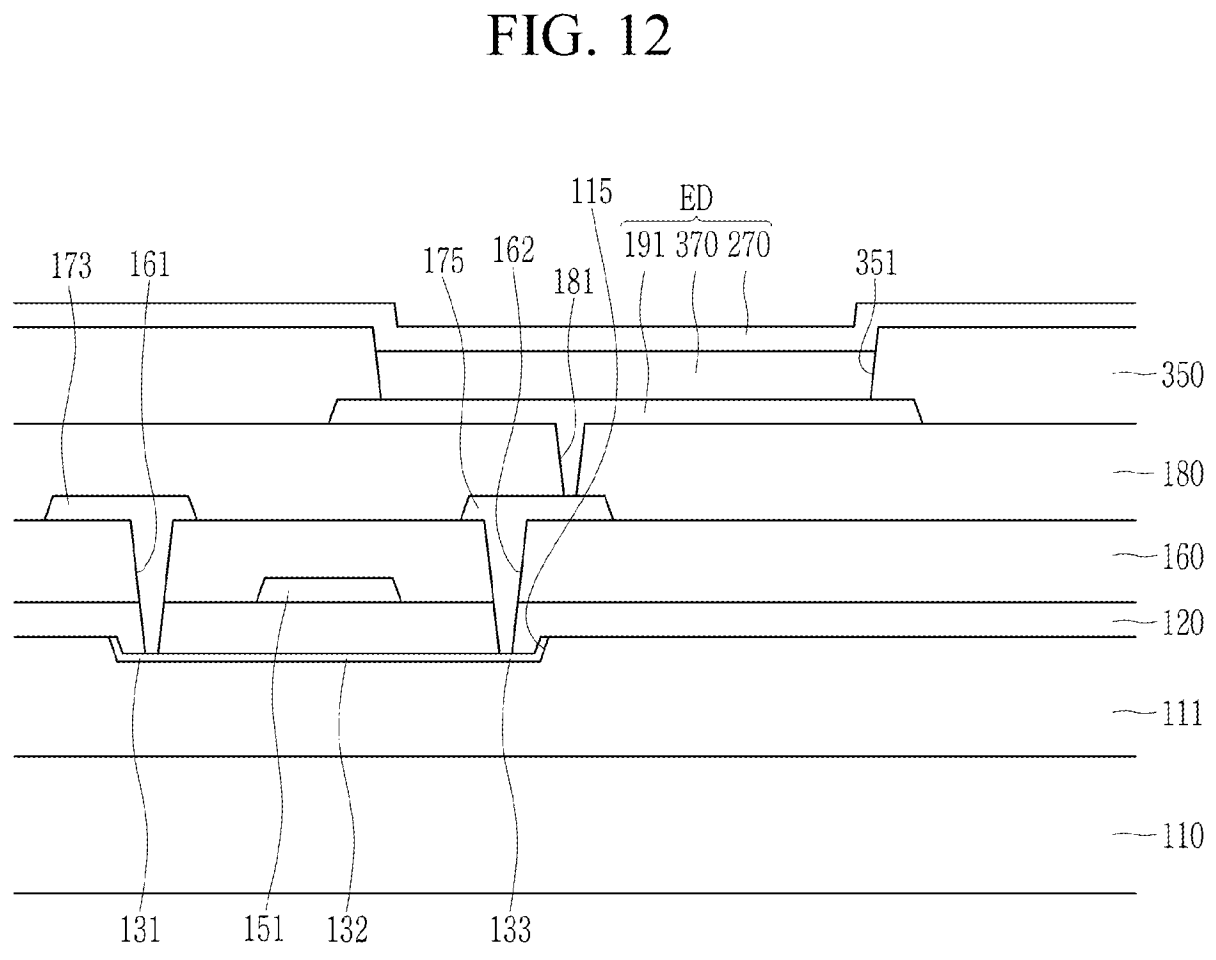

FIG. 12 is a cross-sectional view showing one pixel of a display device including a thin film transistor according to an embodiment.

As shown in FIG. 12, the display device including the thin film transistor according to an embodiment includes a substrate 110, a buffer layer 111 positioned on the substrate 110 and defining a trench 115 therein, a semiconductor 130 positioned in the trench 115 of the buffer layer 111, a gate electrode 151 overlapping the semiconductor 130 in a plan view, and a source electrode 173 and a drain electrode 175 connected to the semiconductor 130.

A passivation layer 180 may be positioned on the source electrode 173 and the drain electrode 175. The passivation layer 180 may be disposed entirely on the substrate 110. The passivation layer 180 may include an organic insulating material such as a generally-used polymer such as polymethyl methacrylate ("PMMA") or polystyrene ("PS"), or a polymer derivative having a phenol-based group, an acryl-based polymer, an imide-based polymer, a polyimide, an acryl-based polymer, or a siloxane-based polymer.

A pixel electrode 191 may be positioned on the passivation layer 180. The passivation layer 180 may define an opening 181 overlapping the drain electrode 175 and the pixel electrode 191 in a plan view. The pixel electrode 191 may be connected to the drain electrode 175 through the opening 181. The pixel electrode 191 may include a metal such as silver (Ag), lithium (Li), calcium (Ca), aluminum (Al), magnesium (Mg), or gold (Au), and a transparent conductive oxide ("TCO") such as an indium tin oxide ("ITO") and an indium zinc oxide ("IZO"). The pixel electrode 191 may be made of a single layer including a metal material or a transparent conductive oxide, or a multilayer including these. For example, the pixel electrode 191 may have a triple-layered structure of indium tin oxide (ITO)/silver (Ag)/indium tin oxide (ITO).

A partition wall 350 may be positioned on the pixel electrode 191. The partition wall 350 may include an organic insulating material such as a generally-used polymer such as polymethyl methacrylate (PMMA) or polystyrene (PS), or a polymer derivative having a phenol-based group, an acryl-based polymer, an imide-based polymer, a polyimide, an acryl-based polymer, or a siloxane-based polymer. A pixel opening 351 may be defined in the partition wall 350, and the pixel opening 351 may overlap the pixel electrode 191 in a plan view.

A light-emitting element layer 370 may be positioned within the pixel opening 351 of the partition wall 350. The light-emitting element layer 370 may include a material layer that uniquely emits light of primary colors such as red, green, and blue. The light-emitting element layer 370 may have a structure in which a plurality of material layers for emitting light of different colors are stacked. The light-emitting element layer 370 is shown positioned only within the pixel opening 351, but is not limited thereto. The light-emitting element layer 370 may be positioned within the pixel opening 351 as well as over the partition wall 350 in another embodiment. That is, the light-emitting element layer 370 may be positioned on the entirety of the substrate 110.

A common electrode 270 may be positioned on the light-emitting element layer 370 and the partition wall 350. The common electrode 270 may include a reflective metal including calcium (Ca), barium (Ba), magnesium (Mg), aluminum (Al), silver (Ag), platinum (Pt), palladium (Pd), gold (Au), nickel (Ni), neodymium (Nd), iridium (Ir), chromium (Cr), lithium (Li), and calcium (Ca), or a transparent conductive oxide ("TCO") such as an indium tin oxide (ITO) and an indium zinc oxide (IZO).

The pixel electrode 191, the light-emitting element layer 370, and the common electrode 270 form a light emitting diode ("LED") ED. Here, the pixel electrode 191 may be an anode that is a hole injection electrode, and the common electrode 270 may be a cathode that is an electron injection electrode. However, an embodiment is not limited thereto, and according to a driving method of the organic light emitting device, the pixel electrode 191 may be a cathode, while the common electrode 270 may be an anode.

Holes and electrons are respectively injected into the light-emitting element layer 370 from the pixel electrode 191 and the common electrode 270, and light is emitted when an exciton that is a combination of the injected holes and electrons falls from an excited state to a ground state.

In addition, an encapsulation layer including an inorganic insulating material and an organic insulating material may be positioned on the common electrode, and a filling layer including a filler may be positioned on the encapsulation layer. On the filling layer, a cover layer including an insulating material, a color conversion layer, and a transmission layer may be positioned. The color conversion layer may be positioned on some pixels, and the transmission layer may be positioned on some other pixels. The color conversion layer may include a semiconductor nanocrystal, and the semiconductor nanocrystal may include at least one of a phosphor and a quantum dot material that converts incident light into another color. Quantum dots may control a color of light emitted according to a particle size, and accordingly, the quantum dots may have various emission colors such as blue, red, and green. The transmission layer may transmit incident light and may include a polymer material.

While this disclosure has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

DESCRIPTION OF SYMBOLS

110: substrate
111: buffer layer

115: trench
120: gate insulating layer
130: semiconductor
131: first region of semiconductor
132: channel of semiconductor
133: second region of semiconductor
151: gate electrode
173: source electrode
175: drain electrode
500: first photoresist pattern
550: second photoresist pattern
600: semiconductor material layer

What is claimed is:

1. A thin film transistor comprising:
a substrate;
a buffer layer positioned on the substrate and defining a trench on an upper surface thereof;
a semiconductor positioned in the trench of the buffer layer;
a gate electrode overlapping the semiconductor in a plan view;
a gate insulating layer, which is positioned between the semiconductor and the gate electrode, extends to cover a remaining portion of the upper surface of the buffer layer outside the trench, and fills a space inside the trench over the semiconductor such that a height of a portion of a bottom surface of the gate insulating layer inside the trench is lower than a height of a portion of the bottom surface of the gate insulating layer outside the trench; and
a source electrode and a drain electrode, which are connected to the semiconductor.

2. The thin film transistor of claim 1, wherein the semiconductor is positioned only within the trench, and not outside the trench.

3. The thin film transistor of claim 1, wherein the semiconductor includes
a channel overlapping the gate electrode in the plan view, and
a first region and a second region, which are positioned on opposite sides of the channel, respectively,
wherein the first region is connected to the source electrode, and
the second region is connected to the drain electrode.

4. The thin film transistor of claim 3, wherein the channel, the first region, and the second region of the semiconductor are positioned within the trench as a whole.

5. The thin film transistor of claim 3, wherein a width of the channel of the semiconductor is the same as a width of the trench.

6. The thin film transistor of claim 1, wherein the semiconductor is made of an oxide semiconductor.

7. The thin film transistor of claim 1, wherein a thickness of a first part of the gate insulating layer, which overlaps the semiconductor, is greater than a thickness of a second part of the gate insulating layer, which does not overlap the semiconductor.

8. A manufacturing method of a thin film transistor comprising:
forming a buffer layer on a substrate;
forming a trench on an upper surface of the buffer layer;
forming a semiconductor material layer on the buffer layer;
forming a photoresist pattern on the semiconductor material layer;

reducing a thickness of the photoresist pattern to leave a part of the photoresist pattern positioned within the trench and to remove a remaining part of the photoresist pattern outside the trench;
patterning the semiconductor material layer to form a semiconductor by using the photoresist pattern as a mask such that a height of a portion of a top surface of the semiconductor overlapping a center of the trench in a plan view is lower than a height of a portion of the top surface of the semiconductor overlapping a side surface of the trench in the plan view;
forming a gate insulating layer on the semiconductor; and
forming a gate electrode on the gate insulating layer.

9. The manufacturing method of the thin film transistor of claim 8, wherein
the forming of the trench in the buffer layer is performed by a dry etching process.

10. The manufacturing method of the thin film transistor of claim 9, wherein
the semiconductor material layer is made of an oxide semiconductor material.

11. The manufacturing method of the thin film transistor of claim 10, wherein
the patterning of the semiconductor material layer to form the semiconductor is performed by a wet etching process.

12. The manufacturing method of the thin film transistor of claim 8, wherein
the reducing of the thickness of the photoresist pattern is performed by either a chemical mechanical polishing process or an ashing process.

13. The manufacturing method of the thin film transistor of claim 8, wherein
the forming of the photoresist pattern is to coat a photosensitive organic material and to proceed with an exposure process.

14. The manufacturing method of the thin film transistor of claim 13, wherein
the exposure process includes full exposure without a photomask.

15. The manufacturing method of the thin film transistor of claim 8, wherein
in the reducing of the thickness of the photoresist pattern, a reduced upper surface of the photoresist pattern is flush with an upper surface of a portion of the semiconductor material layer positioned outside the trench.

16. The manufacturing method of the thin film transistor of claim 8, wherein
the semiconductor is positioned only within the trench, not outside the trench.

17. The manufacturing method of the thin film transistor of claim 8, wherein
the semiconductor includes
a channel overlapping the gate electrode in the plan view, and
a first region and a second region, which are positioned on opposite sides of the channel, respectively,
wherein the first region is connected to the source electrode, and
the second region is connected to the drain electrode.

18. The manufacturing method of the thin film transistor of claim 17, wherein
the channel, the first region, and the second region of the semiconductor are positioned as a whole within the trench.

19. The manufacturing method of the thin film transistor of claim 8, wherein

13

14 a width of the channel of the semiconductor is the same as a width of the trench.

20. The manufacturing method of the thin film transistor of claim 8, wherein a thickness of a first part of the gate insulating layer, which overlaps the semiconductor, is greater than a thickness of a second part of the gate insulating layer, which does not overlap the semiconductor.

\* \* \* \* \*